United States Patent [19]
Gerdes

[11] 3,968,486
[45] July 6, 1976

[54] ANALOG TO DIGITAL CONVERTER

[76] Inventor: Richard C. Gerdes, 7333 E. 34th St., Tucson, Ariz. 85710

[22] Filed: June 20, 1974

[21] Appl. No.: 481,158

[52] U.S. Cl. .......................................... 340/347 AD
[51] Int. Cl.² .................................... H03K 13/175
[58] Field of Search ........................... 340/347 AD

[56] References Cited
UNITED STATES PATENTS

| | | | |
|---|---|---|---|
| 2,453,454 | 11/1948 | Norwine | 340/347 AD |
| 2,950,469 | 8/1960 | Raasch | 340/347 AD |
| 3,100,298 | 8/1963 | Fluhr | 340/347 AD |
| 3,225,347 | 12/1965 | Doyle | 340/347 AD |
| 3,255,447 | 6/1966 | Sharples | 340/347 AD |
| 3,315,251 | 4/1967 | Kaneko | 340/347 AD |

*Primary Examiner*—Charles D. Miller
*Attorney, Agent, or Firm*—J. Michael McClanahan

[57] ABSTRACT

An electronic analog to digital converter utilizing a plurality of analog comparators, all comparators receiving a common analog input and separate respective reference voltages for comparison. The outputs of the comparators provide respectively the digital word output of the analog to digital converter wherein the output state of the comparators are dependent upon the output state of the prior higher order comparator and where the resolution of the analog to digital converter is dependent on the number of stages of comparators utilized. The referenced voltage for the least significant digital bit is determined by all prior, high order digital output. The analog to digital converter disclosed is of the asynchronous type not requiring a clock signal and the total analog to digital conversion time is $nT_c$, where $n$ is the number of comparator stages and $T_c$ is the response time of the comparator.

2 Claims, 3 Drawing Figures

ANALOG TO DIGITAL CONVERTER

BACKGROUND OF THE INVENTION

The present invention relates to electronic analog to digital converters producing a straight binary output equal to, in binary code language, the value of the analog input.

Basically, the analog input is an electric signal having a magnitude which may be steady or may vary. The output thus is a digital word in the form of the number of bit outputs representing the magnitude of the input at any one time, in binary form, i.e., $2^0, 2^1, 2^2, 2^3, \ldots, 2^n$. Each output is either a logic 1 or a logic 0. For an output voltage having logic 0 or 1, the digital word is equal to:

$$E_0(2^0) + E_1(2^1) + E_2(2^2) + E_3(2^3) + \ldots + E_{n-1}(2^{n-1})$$

The above expression is called the binary code and the number of outputs $n$ is called the number of bits.

In a one bit analog to digital converter the output would have a binary coded 0 or 1 corresponding to zero or $2^0$ respectively. A two bit system would have two outputs, each of which could be a 0 or 1. These correspond to binary code of $2^0$ and $2^1$. Thus the numerical value of the output of a two bit system would be $0, 2^0, 2^1$, and $2^0 + 2^1$, corresponding to magnitudes of 0,1,2, and 3 respectively. In an analog to digital converter, the maximum analog input signal acceptable has a certain value which represents the full scale (hereinafter abbreviated FS) analog input voltage. Thus in a two bit analog to digital converter, there being four output numerical values, the digital output would represent input values as follows: 0, FS/4, FS/2, and 3FS/4 where 0 represents 0, $2^0$ represents FS/4, $2^1$ represents FS/2, and $2^0 + 2^1$ represents FS/4 + FS/2 or 3FS/4. The $2^0$ bit is called the least significant bit or LSB and the $2^1$ bit ($2^{n-1}$ bit) is called the most significant bit or MSB. It should also be pointed out that the maximum digital word output corresponds to an input analog value equal to or greater than Fs − 1 LSB. Thus the binary digital output word 11 corresponds to an analog input value equal to or greater than 3FS/4.

Similarly in a 10 bit analog to digital converter there is $2^{10}$ or 1,024 discrete input analog voltage level which may be represented by the binary digital output. The MSB, which would be the $2^{10}$ bit, represents 0.5FS and the LSB represents the $2^0$ bit or (1/1024)FS, a value of less than 0.1%FS. The number of discrete levels or values which may be digitally expressed is equal to $2^n$, where ($n$) is the number of bits. This is called the resolution. In the ten bit analog to digital converter example above, the resolution would be the 0.1% of FS.

SUMMARY OF THE INVENTION

The present invention utilizes the basic concept illustrated in FIG. 1 wherein the analog input is compared with certain proportional magnitudes of the Full Scale Analog input whereby each comparator's reference input is the most significant bit for that comparator in the chain of comparators modified by the output of the comparator just preceding the comparator to which the input is directed.

In FIG. 1, C1, C2, ... Cn are the analog comparators. B1, B2 ... Bn are the digital outputs of the comparators and ultimately, the digital output of the analog to digital converter. V1, V2 ... Vn are the voltage reference inputs to the analog comparators where $n$, which represents the number of bits, also indicates the resolution of the conversion of the analog voltage magnitude to the digital output.

As may be readily seen from FIG. 1 the total conversion time from analog input to digital output is $nT_c$ where $T_c$ is response time of the comparators.

It is an object of the present invention to provide an analog to digital converter which utilizes a series of comparators each receiving the analog input and having a comparison reference voltage which is a function of all prior comparator output states.

It is still another object of the present invention to provide an analog to digital converter of the asynchronous type and not requiring a clock signal.

It is another object of the present invention to provide an analog to digital converter utilizing comparators where the total conversion time is $nT_c$, wherein $n$ is the number of bits and $T_c$ is response time of the comparator.

These and other objects of the present invention will become apparent to those skilled in the art as a description thereof proceeds.

DETAILED DESCRIPTION

Figure 1:
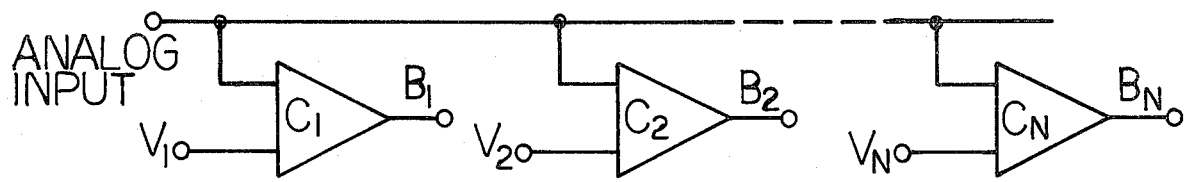
FIG. 1 is a schematic diagram illustrating the basic concept utilized in the invention.

The present invention may be described by reference to FIG. 1 which illustrates the basic concept. To this end, it is necessary that voltage V1 be equal to ½FS and V2 equal to ½FS ± ¼FS. The sign of the ± depends upon output B1 in accordance with the following relationship: If B1 is a logic 1 then the ± is a +. If B1 output is a logic 0, then the ± is a −.

The output of each comparator is a logic 1 when the analog input to the comparator is more positive than the referenced voltage input ($V_n$). If the analog input is less positive than the referenced voltage ($V_n$), the comparator output will be logic 0. It is noted that in our example we are assuming that the logic 1 is a positive voltage and logic 0 is zero voltage. The invention, of course, is not necessarily restricted to positive voltage and zero voltage as its binary output.

In the above example, if the analog input is greater than ½FS, the output of the comparator C1 is logic 1 indicating the most significant bit or MSB to be a 1.

Similarly, the reference voltage V2 input to comparator C2 will be ½FS + ¼FS since output B1 of comparator C1 was a logic 1 in the present example. Obviously then, the input analog voltage is compared by comparator C2 with a value of V2 which is ¾FS so that output B2 of comparator C2 will be a logic 1 only if the analog input is greater than ¾FS.

Thus, the input reference voltage V2 may be characterized by the following formula:

$$V_2 = \tfrac{1}{4}FS + \tfrac{1}{2}FS(B1)$$

Where B1 equals 1 or 0. Similarly, reference voltage $V_3$ directed to comparator C3 is described by the following equation:

$$V_3 = \tfrac{1}{2}FS \pm \tfrac{1}{4}FS \pm \tfrac{1}{8}FS$$

where the $\pm$ on the second term is + if B1 equals logic 1 and negative if B1 equals logic 0. Similarly the $\pm$ on the third term of the expression is + if B2 equals logic 1 and − if B2 equals logic 0. Similarly it may be stated that $$V_n = \tfrac{1}{2}FS \pm \tfrac{1}{4}FS \pm \tfrac{1}{8}FS \pm \ldots \pm 1/nFS$$

where the $\pm$ on the second term is the function of B1, the $\pm$ on the third term is a function of B2, and the $\pm$ on the $n^{th}$ term is a function of $B_{n-1}$.

The reference voltage utilized may thus be characterized by reversing the orders of the terms to read as follows:

$$V_n = \tfrac{1}{2}^n FS \pm \tfrac{1}{2}^{n-1}FS(B_{n-1}) \pm \ldots \pm \tfrac{1}{2}FS(B1)$$

where the $\pm$ sign before each term is as previously described.

Figure 2:
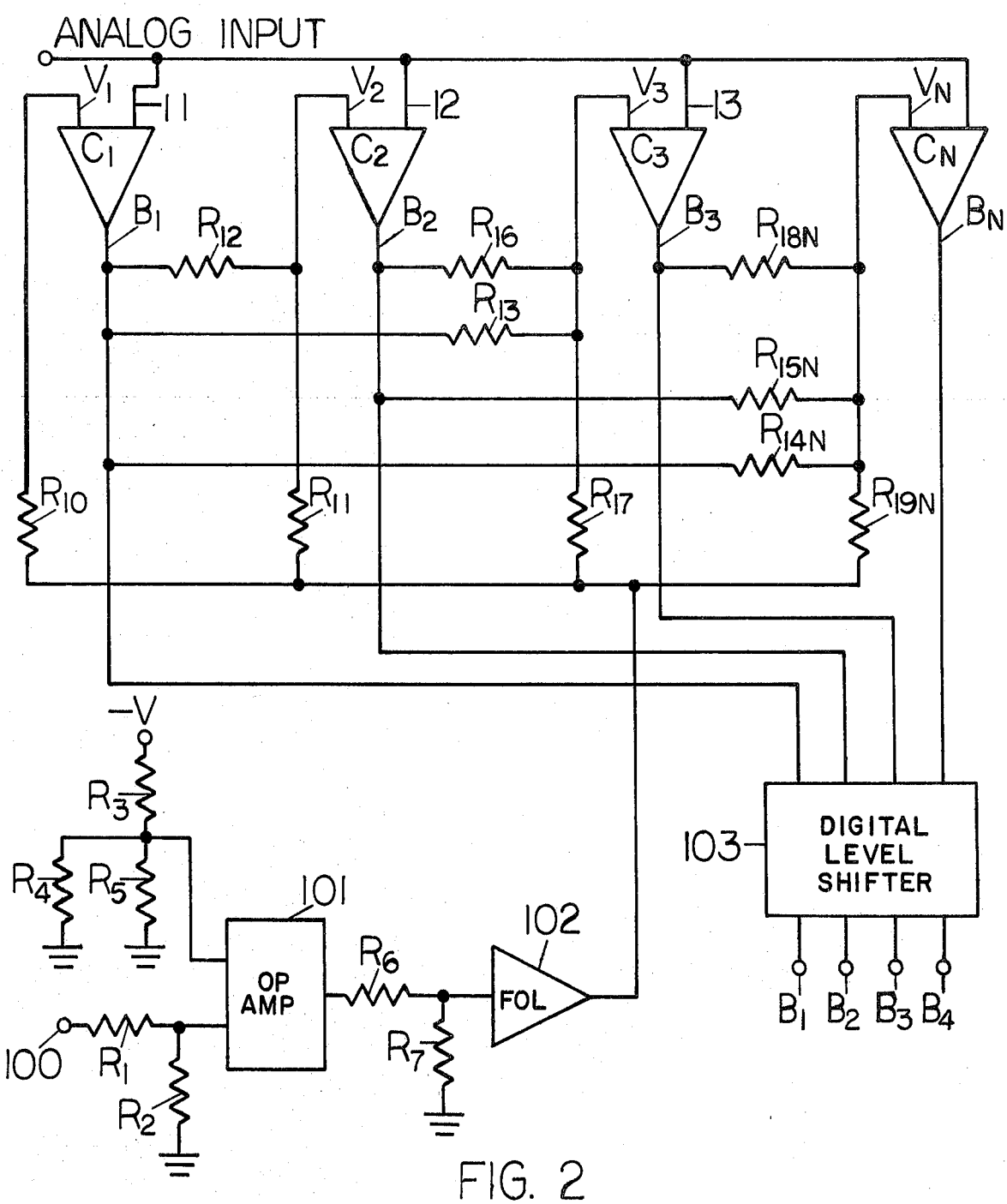
FIG. 2 is a partial schematic circuit diagram useful in the description of the present invention.

Referring to FIG. 2, the basic circuitry is indicated for the generation of the various reference voltages that are applied to the comparators. An original reference voltage is supplied to terminal 100 which in turn is voltage divided by resistor network R1 and R2 and then directed to one input of general purpose dual operational amplifier 101. The negative power supply reference voltage which operates the analog to digital converter, −V is also fed into dual operational amplifier 101 through voltage divider resistor network R3, R4, and R5. The output of the dual operational amplifier (OP AMP) 101 is directed through a voltage divider network R6 and R7 to high input impedence and low output impedence voltage follower (FOL) 102 whose output follows the input and provides the basic voltage reference for the analog comparators C1, C2, C3 . . . Cn. It is noted that the voltage output of component 102 is basically the same as V1 directed to the input of comparator C1 as resistor $R_{10}$ is of relatively low value in comparison with the input impedance of C1, which may be a megohm.

The output of voltage follower 102 is directed through resistor R10 to input V1 of comparator 1. The value of V1 at comparator C1 is adjusted to ½FS through adjustments made in dual operational amplifier 101. The analog input to the analog to digital converter is directed to input 11 of comparator C1. As indicated previously, the output of comparator C1, B1 is a logic 1 if analog input 11 is greter than V1. If the converse is true, B1 is a logic 0.

The output of comparator C1, i.e., B1, which is logic 1 or 0, in terms of voltage magnitude for the logic bits may be the same as the full scale voltage (FS) or it may be different. However, the voltage level which is chosen to indicate logic 1 must be known in order to properly divide B1 and the output of voltage follower 102 to arrive at value V2, which is taken at the resistor network R11 and R12 junction and directed to comparator C2.

V1, as stated before, is set to ½ Full Scale (FS). V2, which is the combination of B1 and the output of voltage follower 102, V1, is equal to ½FS(V1) ± ¼FS which sign as hereinbefore mentioned, depends on ouput B1. Thus may be seen in the event that B1 is a logic 1 and is full scale in magnitude, V2 will equal ¾FS when, for example, R11 and R12 are of equal value. As mentioned, in the event B1 is zero, then V2 will equal ¼FS.

Input V2 to comparator C2 is compared with analog input 12 by comparator C2 and output B2 follows the same rule of construction already established. Output B2 is directed through resistor R16 to join V1 through R17 at input V3 to comparator C3. Voltage reference V3 is compared with the analog input 13 by comparator C3 to produce output V3 which is a logic 1 or 0 depending upon the relative magnitudes of analog inputs 13 and V3. V3, is noted in accordance with the formula which has previously been derived, is the sum of three factors, namely, V1, B2, and by means of resistor R13, B1. The magnitude of resistor 13 is that it is ½ the value of R16 and R17, R16 and R17 being of equal value. Thus V1(½FS), which is directed to R17, adds (or subtracts) B2 through resistor R16 and B1 through R13, B2 and B1 subtracting from or adding to V1 in accordance with whether they are a logic 1 or 0.

Continuing on, $V_n$, which is the voltage reference directed to comparator $C_n$, is the sum of the voltage output $B_{n-1}$ (B3 in FIG. 2) and V1 through resistors $R19_n$ and resistor $R18_n$, $B_{n-2}$ (B2 in FIG. 2) through resistor $R15_n$ which is one half the value of $R18_n$ or $R19_n$, which are of the same value, and $B_{n-3}$ (B1 in FIG. 2) through resistor $R14_n$ which is ¼ the value of equal resistors $R18_n$ and $R19_n$.

As may be seen from FIG. 2, the partial schematic diagram, outputs B1, B2, B3, and $b_n$ are directed to digital level shifter 103 which acts as a buffer between the subject analog to digital converter and the desired electronic networks to which the convertor feeds information.

Figure 3:
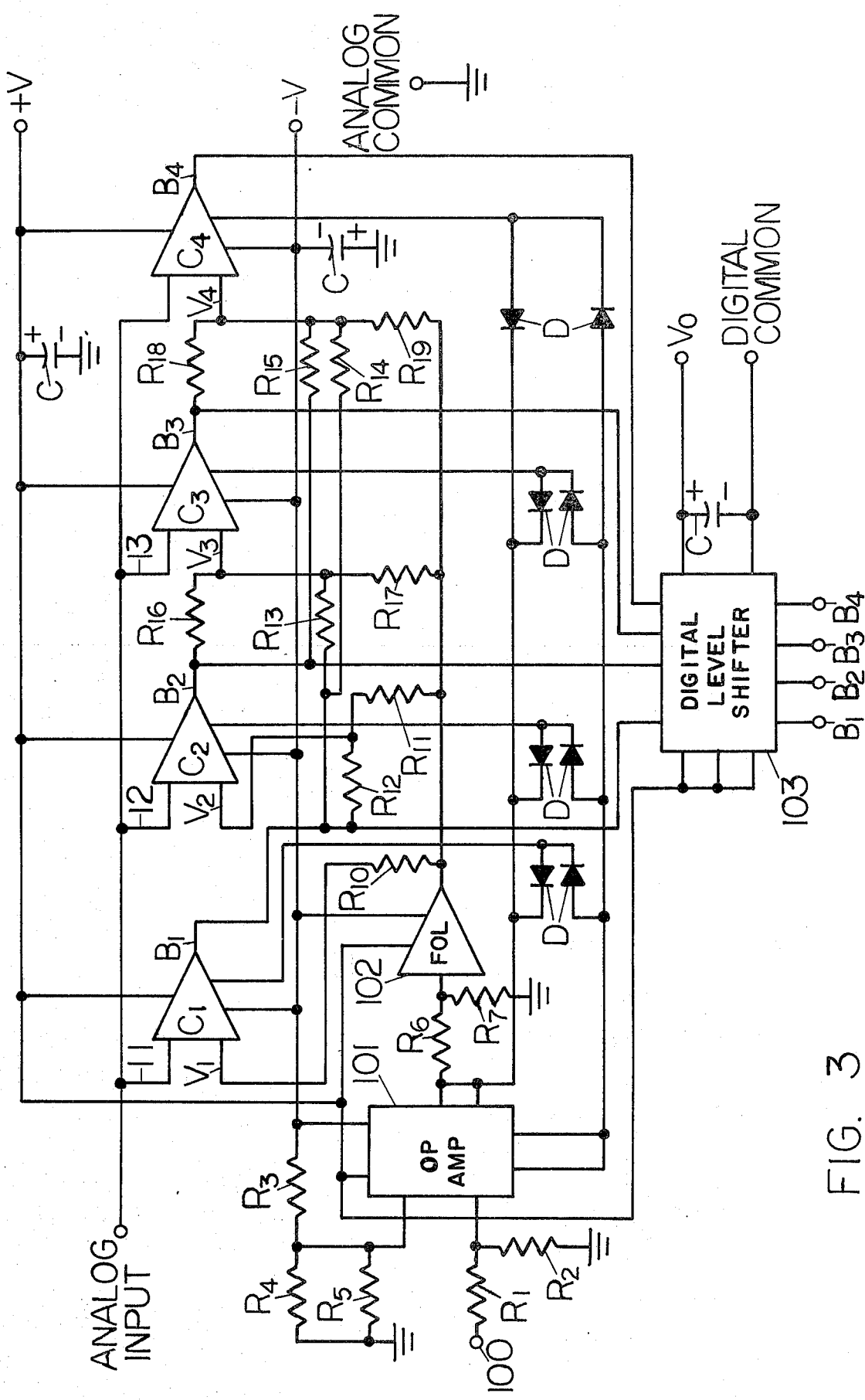
FIG. 3 is the schematic circuit diagram of the analog to digital converter constructed in accordance with the teachings of the present invention.

Referring to FIG. 3, the completed schematic of the inventive analog to digital converter, the voltages which supply the components in the circuit are indicated such as +V, −V and the convertor common ground. The decoupling capacitors C illustrated remove voltage spikes which appear on the voltage sources. Diodes D act to clamp the output of the comparators at the desired levels usually zero and FS. Nominally, full scale voltage is obtained from the dual operational Amplifier 101 to connect to one side of the diodes D and the other side of the diodes D not connected to the comparator is usually placed at zero volts or ground at the dual operational Amplifier 101.

Voltage $V_0$ is the voltage supplied the digital level shifter 103 as the reference voltage desired for the bit output to make the output compatible with other electronic circuitry receiving the bit information.

It is noted that all components shown in this invention are commercially available components, for example, the general purpose dual operational amplifier 101 may be national semi-conductor product Number LM1458H, comparators C1, C2, C3 . . . $C_n$ are commercially available operational amplifiers such as RCA CA3100. Further, the voltage follower 102 is commercially available such as national semi-conductor product LM310H, and the digital level shifter 103 may be RCA product CD4010A.

The remaining components, resistors, capacitors, and diodes are standard items well known in the field.

While a preferred embodiment has been shown and described, it will be understood that there is no intent to limit the invention by such disclosure but, rather, it is intended to cover all modification in alternate construction falling within the spirit and scope of the invention as defined in the appended claims.

I claim:

1. An analog to digital converter of the asynchronous type comprising first, second, third, and fourth voltage comparators having two voltage inputs whose voltages are compared and a voltage output, a first input to each said comparators being the input analog voltage, the second input to the first voltage comparator resistively connected to a pre-determined reference voltage; said pre-determined reference voltage comprising the output of a voltage follower, the voltage follower having an input operably connected to the output of a dual operational amplifier, said dual operational amplifier having two inputs, one an exterior reference voltage and the other a negative power supply voltage; the output of said first voltage comparator connected to the input of a digital level shifter, resistively connected to the second input of the second voltage comparator, resistably connected to the second input of the third voltage comparator, and resistably connected to the second input of the fourth voltage comparator; the second input to the second voltage comparator additionally resistably connected to the output of the voltage follower; the output of the second voltage comparator operably connected to the input of the digital level shifter, resistably connected to the second input of the third voltage comparator, and resistably connected to the second input of the fourth voltage comparator; the second input of the third voltage comparator additionally resistably connected to the output of the voltage follower; the output of said third voltage comparator operably connected to the input of the digital level shifter, and resistably connected to the second input of the fourth voltage comparator; said fourth voltage comparator second input additionally resistably connected to the output of the voltage follower and the output of the fourth voltage comparator operably connected to the input of the digital level shifter, wherein the output of the digital level shifter comprise the digital outputs of the analog to digital converter.

2. The analog to digital converter as defined in claim 1, wherein said voltage comparator comprises operational amplifier RCA CA 3100, said dual operational amplifier comprises National Semi-conductor LM 1458H and voltage follower comprises National Semi-conductor LM 310H, and said digital level shifter comprises RCA CD 4010A.

* * * * *